(12) United States Patent
Park et al.

(10) Patent No.: US 10,797,236 B2
(45) Date of Patent: Oct. 6, 2020

(54) OPERATION METHOD OF RESISTIVE MEMORY DEVICE

(71) Applicant: Seoul National University R&DB FOUNDATION, Seoul (KR)

(72) Inventors: Byung-Gook Park, Seoul (KR); Min-Hwi Kim, Seoul (KR); Sungjun Kim, Seoul (KR)

(73) Assignee: SEOUL NATIONAL UNIVERSITY R&DB FOUNDATION (KR)

( * ) Notice: Subject to any disclaimer, the term of this patent is extended or adjusted under 35 U.S.C. 154(b) by 0 days.

(21) Appl. No.: 16/200,853

(22) Filed: Nov. 27, 2018

(65) Prior Publication Data

US 2019/0165268 A1 May 30, 2019

(30) Foreign Application Priority Data

Nov. 29, 2017 (KR) .................. 10-2017-0161384

(51) Int. Cl.
*G11C 13/00* (2006.01)
*H01L 45/00* (2006.01)
*G06N 3/063* (2006.01)

(52) U.S. Cl.
CPC ......... *H01L 45/1253* (2013.01); *G06N 3/063* (2013.01); *G11C 13/0011* (2013.01); *G11C 13/0069* (2013.01); *H01L 45/145* (2013.01); *G11C 13/004* (2013.01); *G11C 13/0097* (2013.01); *G11C 2013/0045* (2013.01); *G11C 2013/0078* (2013.01); *G11C 2213/33* (2013.01); *G11C 2213/34* (2013.01)

(58) Field of Classification Search
CPC .............. G11C 13/0069; G11C 13/004; G11C 13/0097; G11C 2013/0045; G11C 2013/0078; G11C 2213/33; G11C 2213/34; G11C 13/0011; H01L 45/1253; H01L 45/145; G06N 3/063
See application file for complete search history.

(56) References Cited

U.S. PATENT DOCUMENTS

| | | | | |
|---|---|---|---|---|
| 10,127,960 | B1* | 11/2018 | Nobunaga | G11C 11/1673 |
| 2006/0266991 | A1* | 11/2006 | Chang | H01L 45/06 257/4 |
| 2008/0006907 | A1* | 1/2008 | Lee | G11C 11/5685 257/613 |
| 2009/0225583 | A1* | 9/2009 | Lee | G11C 13/0007 365/148 |

(Continued)

FOREIGN PATENT DOCUMENTS

| KR | 10-1257365 | 4/2013 |
|---|---|---|
| KR | 10-1425857 | 7/2014 |

*Primary Examiner* — Khamdan N. Alrobaie
(74) *Attorney, Agent, or Firm* — Gerald E. Hespos; Michael J. Porco; Matthew T. Hespos

(57) ABSTRACT

A resistive memory device and a method of operation of the resistive memory device are provided. The resistance memory device includes a resistance change layer that has a tunneling film and has many states. The conductance is changed symmetrically in a SET operation and a RESET operation. Thus, the resistive memory device can be used for efficient and accurate data storage as a RRAM in a high-capacity memory array, and as a synaptic device controlling the connection strength of a synapse in a neuromorphic system.

2 Claims, 5 Drawing Sheets

(56) References Cited

U.S. PATENT DOCUMENTS

| | | | |
|---|---|---|---|
| 2012/0120711 A1* | 5/2012 | Rabkin | G11C 13/0069 365/148 |
| 2012/0294063 A1* | 11/2012 | Mizuguchi | G11C 13/0011 365/148 |
| 2013/0201750 A1* | 8/2013 | Lee | G11C 13/0064 365/148 |
| 2013/0306932 A1* | 11/2013 | Fujii | H01L 45/085 257/4 |
| 2014/0353567 A1* | 12/2014 | Wang | H01L 45/1233 257/2 |
| 2016/0104838 A1* | 4/2016 | Park | H01L 45/1273 257/4 |
| 2016/0104839 A1* | 4/2016 | Park | H01L 45/1273 257/5 |
| 2017/0025605 A1* | 1/2017 | Park | H01L 45/1233 |
| 2019/0244661 A1* | 8/2019 | Kim | H01L 27/2463 |

\* cited by examiner

FIG. 7
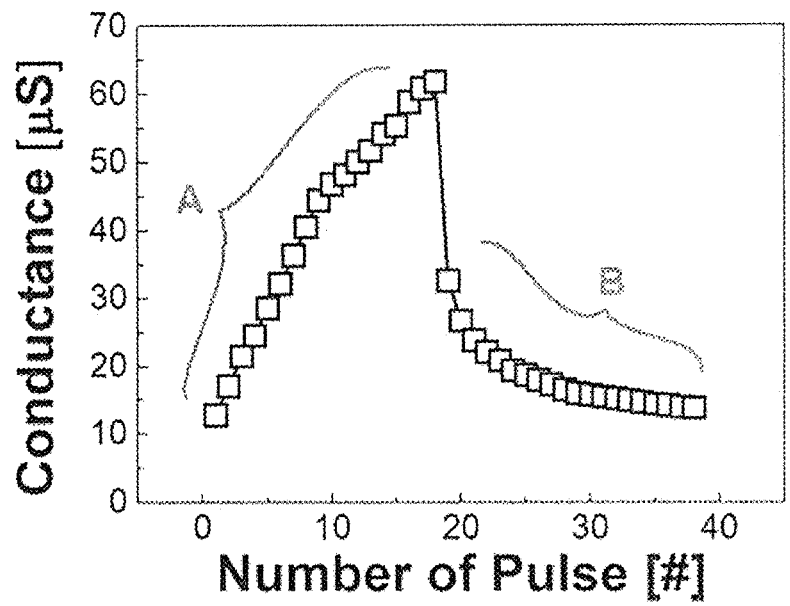
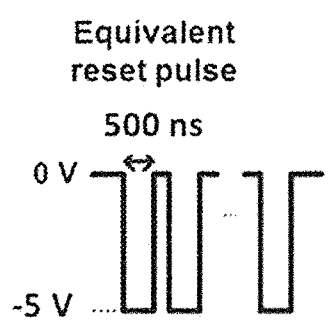
FIG. 8A
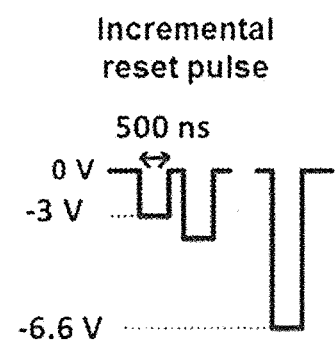
FIG. 8B

OPERATION METHOD OF RESISTIVE MEMORY DEVICE

CROSS-REFERENCE TO RELATED APPLICATION

This application claims priority to Korean Patent Application No. 10-2017-0161384, filed on Nov. 29, 2017, under 35 U.S.C. 119, the entire contents of which are hereby incorporated by reference.

BACKGROUND

Field of the Invention

The present invention relates to a resistive memory device, and more particularly to a resistance change memory device, in which the conductance is changed symmetrically in a SET operation and a RESET operation, and a method of operation thereof. The resistive memory device of the present invention is used for efficient and accurate data storage as a RRAM (Resistive Random Access Memory) in a high-capacity memory array, and as a synaptic device in a neuromorphic system.

NAND flash memory technology is currently leading the mass storage market through continuously scaling down. However, in recent years, as the size of the device has been reduced to 20 nm or less, several reliability problems have arisen. Therefore, various kinds of next generation memories are being actively researched to replace the NAND flash memory technology.

Among the next generation memories, the resistive memory device has a simple device structure and the advantages of fast operation and low power operation. The resistive memory stores data through the difference in resistance state, unlike the NAND flash memory technology which stores charge. It has a high resistance state (HRS) and a low resistance state (LRS), and it may have several resistance states depending on the material and structure of the device.

The conventional resistive memory device has a metal-insulator-metal (MIM) material structure as shown in FIG. 1. The switching operation of the resistive memory device is divided into three phases as shown in FIG. 2: a forming process for forming a conductive filament in an initial state to be a low resistance state, a reset operation for increasing the resistance of the conductive filament by breaking the conductive filament, and a set operation to be the low resistance state again. The forming process is the first operation of the set operation and requires a higher voltage. Generally, in the SET operation, a positive voltage is applied to both ends of the resistive memory device and in the RESET operation, a negative voltage is applied.

Related Art

Korean Patent No. 10-1257365 discloses a technique for simultaneously forming a threshold switch layer and a resistance change layer. According to this, the bottom electrode is platinum (Pt), the top electrode is a transition metal such as tungsten (W), and the phase change layer between the electrodes is a niobium oxide ($Nb_2O_{6-x}$), a vanadium oxide ($V_2O_{6-x}$) or a transition metal oxide formed of Ti, Fe, Ni and the like. Applying a voltage to the electrodes to move the oxygen ions in the phase change layer inside the top electrode, a resistance change layer is formed in the top electrode by the oxidation reaction. And the threshold switch layer having the properties of the conductor is formed by growth from the bottom electrode changing the oxygen deficiency (oxygen vacancies) state by the thermal energy applied with the voltage. Thus, it shows that it is possible to form two films having different properties in a single forming process.

The above patent has the conventional MIM structure, so the lower electrode is platinum, the top electrode is a transition metal such as tungsten, and between these electrodes the transition metal oxide is filled. Applying a voltage to the electrodes it is to move the oxygen ions to form the threshold switch layer and the resistance change layer. There is a limit to reduce the size of the device and it is difficult to implement a three-dimensional vertical stacked array for the neuromorphic system. And there is a problem that should be prepared in a separate process because it is impossible to be fabricated together with the array peripheral circuit elements and is not compatible with the conventional silicon process.

On the other hand, in order to implement the neuromorphic system, it is essential to develop the synaptic device that can simulate one of the characteristics of biological synapses, i.e., the synaptic connectivity, which is potentiated or depressed according to the difference in fire time between pre- and post-neuron synapses (see Korean Patent No. 10-1425857).

However, in the conventional resistive memory device, since the SET operation by the positive voltage and the RESET operation by the negative voltage vary asymmetrically with respect to each other, when the resistive memory device is used as a synaptic device, it is difficult to improve recognition accuracy in a neuromorphic system.

SUMMARY

The present invention is to provide a resistive memory device and a method of operation thereof to solve the above problems and to be used for efficient and accurate data storage as a RRAM in a high-capacity memory array and as a synaptic device in a neuromorphic system.

To achieve the objectives, a resistive memory device according to the present invention is comprising: a bottom electrode formed by doping impurities into a semiconductor material; a resistance change layer formed on the bottom electrode; and a top electrode formed on the resistance change layer, wherein the resistance change layer comprises an oxide film formed on the bottom electrode and a nitride film formed on the oxide film.

The semiconductor material may be silicon, the oxide film may be a silicon oxide film, the nitride film mat be a silicon nitride film, and the top electrode may be formed of a metal.

In a method for operating the resistive memory device of the present invention, pulse voltages having a constant width may be applied between the top and bottom electrodes at a predetermined interval to gradually change the conductance of the resistance change layer.

SET operation may be performed when the pulse voltages are applied to the top electrode with positive voltages higher than those to the bottom electrode and RESET operation may be performed when the pulse voltages are applied to the top electrode with negative voltages lower than those to the bottom electrode.

The SET operation may be performed when the pulse voltages are repeatedly applied at a plurality of times regardless of the magnitude of the pulse voltages.

The RESET operation may be performed when the pulse voltages are repeatedly applied at a plurality of times with the magnitude of the pulse voltages being gradually increased.

A read operation of the storage state or the recognition state may be performed by a slope of the conductance of the resistance change layer when predetermined read pulse voltages are applied between the top and bottom electrodes.

The present invention provides a resistive memory device comprising a tunneling film and has many states. The conductance is changed symmetrically in a SET operation and a RESET operation. Thus, the resistive memory device of the present invention can be used for efficient and accurate data storage as a RRAM in a high-capacity memory array, and as a synaptic device controlling the connection strength of a synapse in a neuromorphic system.

BRIEF DESCRIPTION OF DRAWINGS

FIG. 7 is an electrical characteristic diagram showing a change in conductance according to continuous pulse voltages of a resistive memory device having a silicon nitride film and a silicon oxide film as a resistance change layer according to an embodiment of the present invention.

FIGS. 8A and 8B illustrate input pulse schemes where the magnitude of the pulse voltages is fixed and gradually increased, respectively when for RESET operation the pulse voltages having a constant width are repeatedly applied at a predetermined interval.

In these drawings, the following reference numbers are used throughout: reference number 10 indicates a bottom electrode, 20 an oxide film (a silicon oxide film), 30 a nitride film (a silicon nitride film), and 40 a top electrode.

DETAILED DESCRIPTION

Detailed descriptions of preferred embodiments of the present invention are provided below with accompanying drawings.

Figure 1:
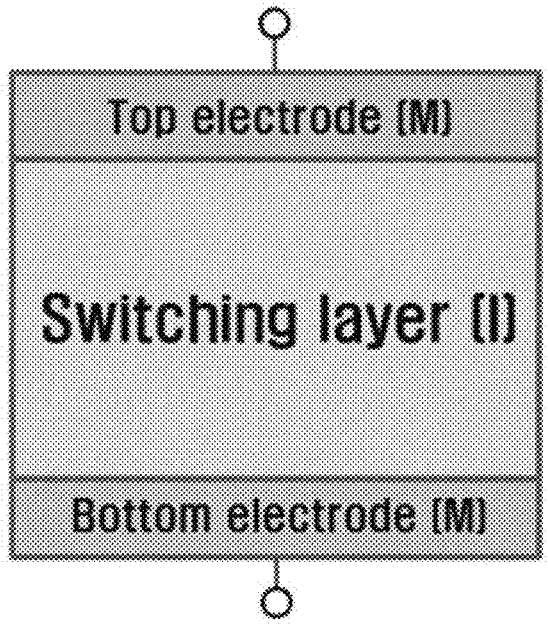
FIG. 1 is a cross-sectional view showing a basic structure of a conventional resistive memory device.
Figure 2:
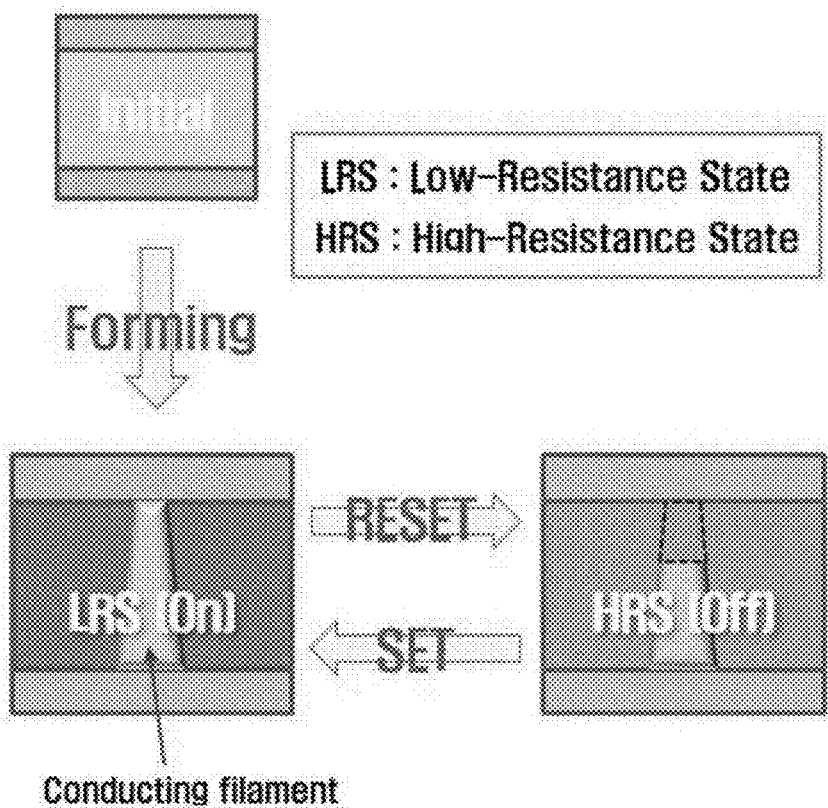
FIG. 2 is a conceptual diagram showing the switching operation characteristics of the resistive memory device having the structure of FIG. 1.
Figure 3:
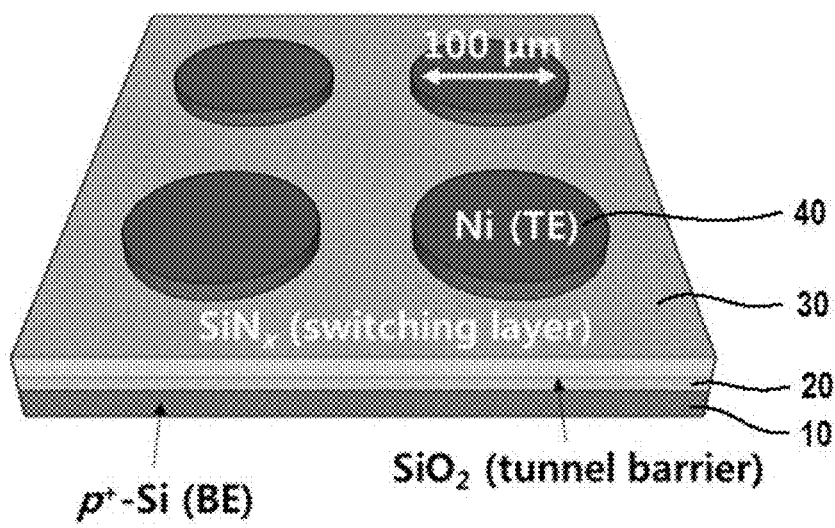
FIG. 3 is 3 is a perspective view illustrating the structure of a resistive memory device according to an embodiment of the present invention.

As exemplary shown in FIG. 3, a resistive memory device according to an embodiment of the present invention comprises a bottom electrode 10 formed by doping impurities into a semiconductor material; a resistance change layer 20 or/and 30 formed on the bottom electrode; and a top electrode 40 formed on the resistance change layer, wherein the resistance change layer comprises an oxide film 20 formed on the bottom electrode 10 and a nitride film 30 formed on the oxide film 20.

The semiconductor material may be other materials such as germanium but may be silicon. In the latter case, it may be crystalline silicon or polycrystalline silicon. Therefore, the bottom electrode 10 may be $p^+$-Si doped with a high concentration of p-type impurities (for example, $5 \times 10^{15}/cm^2$) into silicon as shown in FIG. 3.

The oxide film 20 may be formed of any material if it can be used as a tunneling film. A silicon oxide film ($SiO_2$) is preferable in view of fabrication process when a bottom electrode is formed of silicon. When the silicon oxide film ($SiO_2$) is formed as the oxide film 20, it is preferable to have a thickness of 1 to 2 nm on the $p^+$-Si bottom electrode 10 as shown in FIG. 3, considering tunneling and insulation effects.

The nitride film 30 may be formed of a material having a composition such as AlNx, ZrNx, NiNx, WNx, HfNx, or the like, but is preferably a silicon nitride film ($Si_3N_4$ or SiNx) when the oxide film 20 is formed of a silicon oxide film. When the nitride film 30 is formed of a silicon nitride film, it is preferable to form the nitride film 30 with a thickness of 5 nm on the silicon oxide film (SiO2), as shown in FIG. 3, considering the number of traps that serve as switching.

The top electrode 40 may be formed of a metal such as W, Ni, Ti, TiN, Al or the like which is widely used in a conventional CMOS process because of easy etching. In the embodiment of FIG. 3, nickel (Ni) is formed as a circular disk having a diameter of 100 um as the top electrode 40. But it is not limited thereto.

Figure 4:
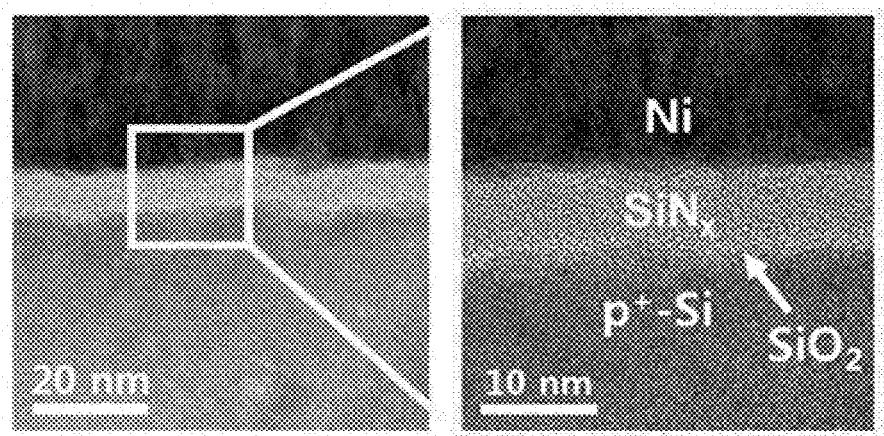
FIG. 4 is a TEM cross-sectional view of the device fabricated with the structure of FIG. 3.

FIG. 4 shows a TEM cross-sectional view and a partially enlarged view of the resistive memory device fabricated in the embodiment of FIG. 3.

Figure 5:
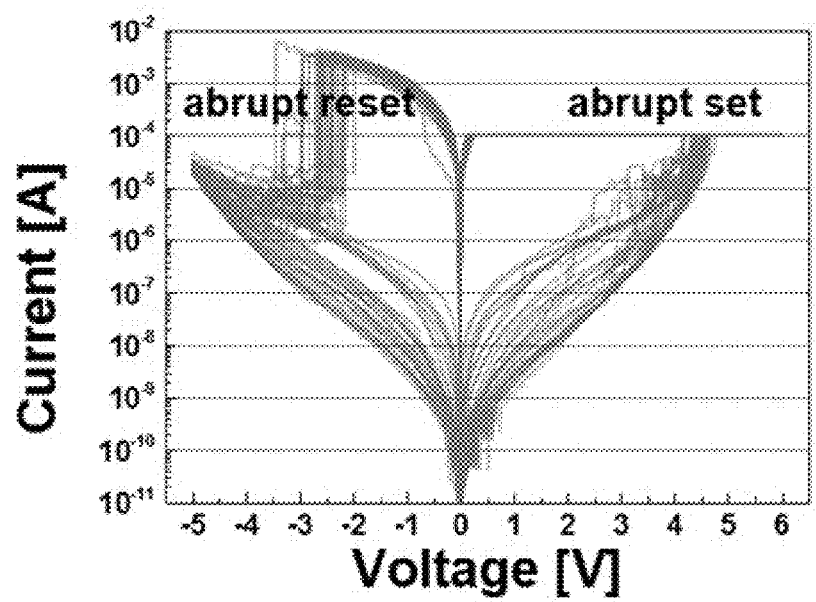
FIG. 5 is a switching characteristic diagram when the silicon oxide film is not inserted in the structure of FIG. 3.
Figure 6:
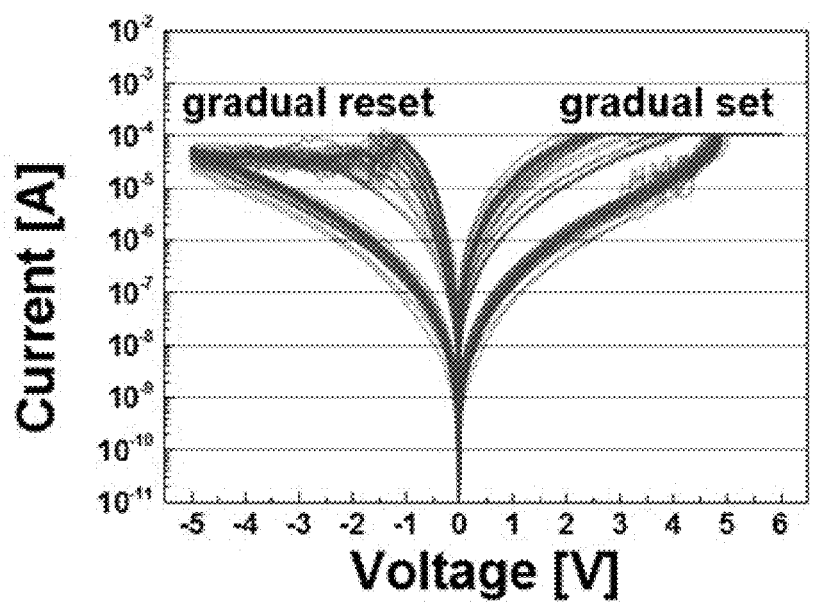
FIG. 6 is a switching characteristic diagram when the silicon oxide film is inserted in the structure of FIG. 3.

FIGS. 5 and 6 show switching characteristics of the resistive memory device fabricated by the embodiment of FIG. 3. The former, FIG. 5, is a result when the silicon oxide film 10 is not inserted in FIG. 3 and the latter, FIG. 6, is when the silicon oxide film 10 is inserted. In the latter case, the several states of resistance can be formed by gradual switching rather than in the former.

FIG. 7 is an electrical characteristic diagram showing a change in conductance with continuous application signals (i.e., pulse voltages) of the resistive memory device having a silicon nitride film 30 and a silicon oxide film 20 as the resistance change layer according to the embodiment of FIG. 3. A positive (+) pulse voltage having a constant size at intervals of 10 seconds is applied to the top and bottom electrodes 18 times, and the conductance is measured at each time. From the 19th time, a negative (−) pulse voltage of the same magnitude as the previous one is repeatedly applied, and the conductance is measured at each time as well.

Referring to FIG. 7, it is showing that the conductance gradually changes in both the SET operation section A in which a positive (+) pulse voltage is applied and the RESET operation section B in which a negative (−) pulse voltage is applied. However, unlike in the SET operation section A, in the RESET operation section B the conductance more abruptly changes asymmetrically. This asymmetrical variation according to the polarity of the pulse voltages is an obstacle to use as a synaptic device.

One of the characteristics of biological synapses, i.e., the synaptic connectivity, which is potentiated or depressed according to the difference in fire time between pre- and post-neuron synapses can be reflected in the polarity of the pulse voltages applied to the synaptic device according to the embodiment of this invention. For example, when the resistive memory device according to the embodiment of FIG. 3 is implemented as a synaptic device, the synaptic connectivity may be potentiated by the SET operation applying a positive (+) pulse voltage to the synaptic device and depressed by the RESET operation applying a negative (−) pulse voltage to the synaptic device.

Here, the application of a positive (+) pulse voltage to the synaptic device means that the top electrode of the synaptic device is applied with a positive voltage high than that applied to the bottom electrode, and the application of a negative (−) pulse voltage to the synaptic device means that the top electrode of the synaptic device is applied with a negative voltage lower than that applied to the bottom electrode.

However, as shown in FIG. 7, when in the RESET operation section B, the conductance is abruptly changed asymmetrically unlike in the SET operation section A, there is a problem that depression of the synaptic connectivity is handled differently from when it is potentiated.

In addition, even when the resistive memory device according to the embodiment of FIG. 3 is used as RRAM for storing data, because in the RESET operation section B, the conductance more rapidly changes than in the SET operation section A and the slope of change in each section is not constant, there is a problem that it is difficult to control the resistance (or conductance) indicating an accurate storage.

In order to solve the above problems, it is preferable that the pulse voltage is gradually increased in the RESET operation as shown in FIG. 8B, and the pulse voltage is repeatedly applied a plurality of times at the interval.

During the SET operation, regardless of the magnitude of the pulse voltage, it may be repeatedly applied a plurality of times at the interval. That is, as shown in FIG. 8A, pulse voltages having a constant magnitude can be applied or as shown in FIG. 8B, pulse voltages being gradually increased in the magnitude can be applied in the SET operation.

Figure 9:
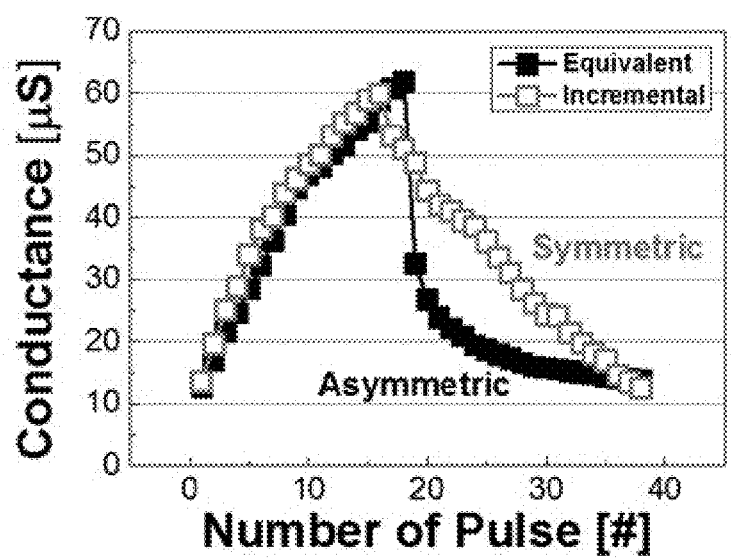
FIG. 9 is an electrical characteristic diagram contrastively showing a change in conductance according to the difference in the operation modes of FIG. 8.

By operating as described above, the conductance can be changed symmetrically in the SET operation and the RESET operation as shown in FIG. 9. Thus, the resistive memory device according to the embodiments described above can be used as a RRAM for efficient and accurate data storage in a high capacity memory array and as a synaptic device adjusting the connection strength of synapses in the neuromorphic system as well.

When used as the RRAM, the storage state of the device can be determined by a slope (for example, 1 or −1) of the conductance of the resistance change layer by applying a predetermined read pulse voltage (e.g., two or more pulse voltages).

On the other hand, when used as the synaptic device, voltages corresponding to a pattern to be recognized are applied as a read pulse (e.g., two or more pulse voltages), and by a slope (for example, 1 or −1) of the conductance of the resistance change layer, it can be recognized whether it is potentiated or depressed with the same accuracy.

What is claimed is:

1. A method for operating a resistive memory device that comprises a bottom electrode formed by doping impurities into a semiconductor material; a resistance change layer formed on the bottom electrode; and a top electrode formed on the resistance change layer, the resistance change layer comprising a tunnel barrier formed on the bottom electrode and a nitride film formed on the tunnel barrier, the method comprising:

performing a SET operation when the pulse voltages are applied to the top electrode with positive voltages higher than those to the bottom electrode, performing a RESET operation when the pulse voltages are applied to the top electrode with negative voltages lower than those to the bottom electrode, performing the SET operation when the pulse voltages are repeatedly applied at a plurality of times regardless of the magnitude of the pulse voltages, performing the RESET operation when the pulse voltages are repeatedly applied at a plurality of times with the magnitude of the pulse voltages being gradually increased, and performing a read operation of the storage state or the recognition state by a slope of the conductance of the resistance change layer when predetermined read pulse voltages are applied between the top and bottom electrodes.

2. A method for operating a resistive memory device that comprises a bottom electrode formed by doping impurities into a semiconductor material; a resistance change layer formed on the bottom electrode; and a top electrode formed on the resistance change layer, the resistance change layer comprising a tunnel barrier formed on the bottom electrode and a nitride film formed on the tunnel barrier, wherein the semiconductor material is silicon, the tunnel barrier is a silicon oxide film, the nitride film is a silicon nitride film, and the top electrode is formed of a metal, the method comprising:

applying pulse voltages having a constant width between the top and bottom electrodes at a predetermined interval to gradually change the conductance of the resistance change layer, performing a SET operation when the pulse voltages are applied to the top electrode with positive voltages higher than those to the bottom electrode, and performing a RESET operation when the pulse voltages are applied to the top electrode with negative voltages lower than those to the bottom electrode, performing the SET operation when the pulse voltages are repeatedly applied at a plurality of times regardless of the magnitude of the pulse voltages, performing the RESET operation when the pulse voltages are repeatedly applied at a plurality of times with the magnitude of the pulse voltages being gradually increased, and performing a read operation of the storage state or the recognition state by a slope of the conductance of the resistance change layer when predetermined read pulse voltages are applied between the top and bottom electrodes.

* * * * *